(12) United States Patent
Chang et al.

(10) Patent No.: US 6,812,140 B2
(45) Date of Patent: Nov. 2, 2004

(54) METHOD FOR CONTACT PROFILE IMPROVEMENT

(75) Inventors: Ching-Tsai Chang, Hsinchu (TW); Kite Huang, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/302,942

(22) Filed: Nov. 25, 2002

(65) Prior Publication Data

US 2003/0186526 A1 Oct. 2, 2003

Related U.S. Application Data

(63) Continuation-in-part of application No. 10/105,428, filed on Mar. 26, 2002, now abandoned.

(51) Int. Cl.$^7$ .......................................... H01L 21/4763
(52) U.S. Cl. ...................... 438/637; 438/639; 438/677
(58) Field of Search ................................ 438/637, 677, 438/639, 745

(56) References Cited

U.S. PATENT DOCUMENTS 5,880,518 A * 3/1999 Oda et al. .................. 257/635
5,981,376 A * 11/1999 Komatsu et al. ............ 438/629

* cited by examiner

Primary Examiner—Phat X. Cao
Assistant Examiner—Theresa T. Doan
(74) Attorney, Agent, or Firm—Dickinson Wright PLLC

(57) ABSTRACT

A method for contact profile improvement is described. The contact window is formed over a substrate having at least one element. A first oxide layer is formed on the substrate. A borophosphosilicate glass layer is formed on the first oxide layer and the borophosphosilicate glass layer is treated by a planarization process. The contact window is formed in the first oxide layer and the borophosphosilicate glass layer. The element on the substrate is exposed therein. A second oxide layer is formed on the borophosphosilicate glass layer, the sidewall and the bottom of the contact window, with overhangs formed at an opening of the contact window. A spacer on the sidewall of the contact window is formed by etching the second oxide layer to further expose the surface of the borophosphosilicate glass layer. Finally, a native oxide on the bottom of the contact window is removed by a wet etching process and the etching selectivity between the native oxide and the spacer is smaller than 1.

20 Claims, 7 Drawing Sheets

US 6,812,140 B2

METHOD FOR CONTACT PROFILE IMPROVEMENT

CROSS-REFERENCE TO RELATED APPLICATIONS

This invention is a continuation-in-part of application Ser. No. 10/105,428 filed Mar. 26, 2002 now ABN, titled "A NEW METHOD FOR CONTACT PROFILE IMPROVEMENT," and assigned to same assignee with the same inventor as the present application.

BACKGROUND OF THE INVENTION

1. Field of Invention

The present invention relates to a semiconductor fabrication method. More particularly, the present invention relates to a method for improving the contact profile.

2. Description of Related Art

Sub-quarter micron multi-level metallization is not only an important technology of very large scale integration (VLSI) but also one of the key technologies for the next generation of ultra large scale integration (ULSI). The multilevel interconnects that lie at the heart of this technology require reliable formation. Reliable formation of these interconnect features is very important to the success of ultra large scale integration and to the continued effort to increase circuit density and quality on individual substrates and dies.

Generally speaking, a contact window is an opening for forming a plug which connects the device on the substrate and conductive line. Typically the method for forming the contact window comprises depositing a silicon oxide layer on a substrate whereon the devices are formed. The material of the silicon oxide layer is formed by a low pressure chemical vapor deposition (LPCVD) process and the starting material for this process is tetraethyl orthosilicate and ozone. The thickness of the silicon oxide layer is about 1000 angstroms. Next, a borophosphosilicate glass layer is formed on the silicon oxide layer as an interlayer-dielectric layer. The thickness of the borophosphosilicate glass layer is about 5000 angstroms.

A chemical mechanical polishing (CMP) process is used to planarize the surface of the borophosphosilicate glass layer. At this stage, a thermal flow process also can be used to achieve the same effect. A photo-resist layer is then formed on the borophosphosilicate glass layer. The photo-resist layer is patterned and the position of the contact window is then defined. The patterned photo-resist layer is used as a mask, the borophosphosilicate glass layer and the silicon oxide layer are etched and the contact window is formed therein. The device on the substrate is exposed in the bottom of the contact window. Typically, the device is a gate or source/drain region.

Because the device on the substrate is exposed in the bottom of the contact window, the silicon material of the substrate reacts with oxygen-containing gas and a native oxide layer forms thereon. The native oxide layer must be removed before the tungsten plug is formed to decrease the sheet resistance between the tungsten plug and the device. The method of removing the native oxide comprises a physical dry etching process and a wet etching process.

Because the native oxide layer is very thin, typically several angstroms to tens of angstroms, the plasma used in physical dry etching easily damages the substrate for the reason of using the argon ion plasma. For this reason, wet etching is typically used to remove the native oxide layer. The method of the wet etching process comprises a substrate sunken in the aqueous solution of hydrogen fluoride and ammonia to remove the native oxide layer. Subsequently, a conformal titanium/titanium nitride (Ti/TiN) layer or a tantalum/tantalum nitride (Ta/TaN) layer is deposited to cover the bottom and the sidewall of the contact window as a glue layer or a barrier layer. A tungsten layer is deposited on the glue or barrier layer by a chemical vapor deposition process and fills the contact window. Finally, a tungsten etching back process is executed to further expose the surface of the borophosphosilicate glass layer and the tungsten plug is complete.

However, there is a serious problem in the method for fabricating a tungsten plug mentioned above. The etching rates of the silicon oxide layer and the borophosphosilicate glass layer in the wet etching process are different. As a result, the contact profile is discontinuous as shown in FIG. 1.

FIG. 1 is a cross-sectional diagram showing a contact window disclosed in the prior art. There is a device 102 in a substrate 100. The method for forming the contact window 108 comprises depositing a silicon oxide layer 104 on the substrate 100 wherein the devices 102 are formed. Then a borophosphosilicate glass layer 106 is formed on the silicon oxide layer 104 as an inter-layer-dielectric layer. A lithographic process and an etching process are performed and the contact window 108 is then defined in the silicon oxide layer 104 and the borophosphosilicate glass layer 106. The device 102 in the substrate 100 is exposed in the bottom of the contact window 108. The native oxide layer (not shown in the scheme) on the surface of the device 102 is removed by a wet etching process.

For the reason that the etching rate of the silicon oxide layer 104 is faster than the etching rate of the borophosphosilicate glass layer 106 in the aqueous solution of hydrogen fluoride and ammonia, when the substrate is submerged in the aqueous solution of hydrogen fluoride and ammonia to remove the native oxide layer (not shown in the scheme), the under cut of the silicon oxide layer 104 pointed out by arrow 110 occurs.

With further reference to FIG. 1, the profile of the contact window 108 is discontinuous because of the under cut of the silicon oxide layer 104. Therefore, the discontinuity of the profiles of the subsequently deposited titanium layer 112/titanium nitride layer 114 are discontinuous as well. Because the silicon oxide layer 104 and the borophosphosilicate glass layer 106 at the position pointed out by arrow 110 are out of the protection provided by titanium layer 112/titanium nitride layer 114, the precursors tungsten hexafluoride and hydrogen used for tungsten deposition process penetrate through the interface of the silicon oxide layer 104 and the borophosphosilicate glass layer 106 at the position pointed out by arrow 110. The tungsten is deposited at the interface of the silicon oxide layer 104 and the borophosphosilicate glass layer 106 and the resultant bridge shorts the device.

Reference is made to FIG. 2, which is a transmitting electron microscope image of FIG. 1. All devices and material in the figure are represented by an abbreviation. For example, "BPSG" is borophosphosilicate glass. "W" is tungsten for a plug. "TEOS" is silicon oxide made from tetraethyl orthosilicate. "Si" is silicon substrate. "WSi" is tungsten silicide and "poly-Si" is poly silicon. The WSi and poly-Si comprise the gate. The bridge shorts the gate and the tungsten plug pointed out by arrow 200 in FIG. 2 makes the transistor fail.

The etching rate of the silicon oxide layer 104 is faster than the etching rate of the borophosphosilicate glass layer 106 in the aqueous solution of hydrogen fluoride and ammonia. A conventional method of solving this problem is to change the composition of the etching solution (such as, hydrogen fluoride: ammonia: deionized water=1:7:130). The etching selectivity between the silicon oxide layer 104 and the borophosphosilicate glass layer 106 is less than 1 in this etching solution. Therefore, the under cut of the silicon oxide layer 104 in the contact window 108 will be avoided and the profile of the contact window 108 is retained.

Although the etching solution provided by the prior art can theoretically solve the problem of different etching rates for oxide and borophosphosilicate glass, this problem cannot be completely solved by this solution. When the borophosphosilicate glass is heated to a high temperature, such as during a deposition process or re-flow process, the boron ions and the phosphorous ions diffuse from the borophosphosilicate glass layer into the silicon oxide layer. The concentration of the boron and phosphorous ions decreases from the top of the borophosphosilicate glass layer to the bottom of the borophosphosilicate glass layer in a gradient. The boron and phosphorous ions have the same distribution in the silicon oxide layer. In other words, the portion of the silicon oxide layer nearer the borophosphosilicate glass layer has a higher boron and phosphorous ion concentration while the portion of the borophosphosilicate glass layer nearer the silicon oxide layer has a lower boron and phosphorous ion concentration. The different boron and phosphorous ion concentrations in the silicon oxide layer and the borophosphosilicate glass layer have different etching rates in each etching solution. It is impossible to solve this problem by modulating the composition of the etching solution. Therefore, another kind of under cut occurs in this situation. Besides, the difference between the wet etching rate of oxide layer and silicon substrate will make a discontinuous profile of the contact window, and this situation could not be improved by a change in the ratio of the wet etching solution.

Reference is made to FIG. 3, a transmitting electron microscope image as described above. All devices and material in the figure are represented as in FIG. 2. For the effect made by the diffusion of the boron and phosphorous ions, the modulation of the composition of the etching solution is not efficacious to solve the problem of the discontinuity of the profile of the contact window. The discontinuity of the profile of the contact window is pointed out by arrow 300 in FIG. 3.

SUMMARY OF THE INVENTION

In accordance with the above background of the invention, the conventional manufacturing method for forming a contact window has disadvantages. The profile of the contact window is discontinuous so that the gas precursors $WF_6$ and $H_2$ penetrate into the interface of the oxide layer and BPSG layer. Tungsten is deposited at the interface and tears away these two layers. A tungsten bridge is formed at the interface and two isolated devices are shorted.

It is therefore an objective of the present invention to provide a method for improving the contact profile, in which the phenomenon of the discontinuity of the contact profile is avoided.

It is another objective of the present invention to provide a method for improving the contact profile, in which not only the phenomenon of the discontinuity of the contact profile is avoided but also tungsten deposition at the interface to bridge two devices is avoided.

It is still another objective of the present invention to provide a method for improving the contact profile, in which a spacer made of high refractive index silicon oxide is formed on the sidewall of the contact window. The unsaturated silicon bond in the silicon oxide spacer traps the penetrating hydrogen to avoid the reduction reaction of the $WF_6$.

It is impossible to stop the diffusion of the boron and phosphorous ions during the thermal process, thus choosing a suitable etching solution for etching the oxide layer and BPSG layer with the same etching rate is also impossible. A spacer on the sidewall of the contact window to separate the sidewall of the contact window from the etching solution can protect the oxide layer and BPSG layer from being etched by etching solution and can keep the profile of the contact window continuous.

In accordance with the foregoing and other objectives of the present invention, a method for improving the contact profile is provided. An insulation layer is deposited on a substrate wherein the devices are formed, the material for forming the insulation layer comprises silicon oxide, silicon nitride and silicon carbon (SiC). The material of silicon oxide is deposited by a low pressure chemical vapor deposition (LPCVD) process and the starting materials for this process are tetraethyl orthosilicate and ozone. Next, a borophosphosilicate glass layer is formed on the insulation layer as an inter-layer-dielectric layer.

The surface of the borophosphosilicate glass layer is planarized by a chemical mechanical polishing (CMP) process or a thermal flow process. A photo-resist layer is then formed on the borophosphosilicate glass layer. The photo-resist layer is patterned and the position of the contact window is then defined. The patterned photo-resist layer is used as a mask, the borophosphosilicate glass layer and the insulation layer are etched and the contact window is formed therein. The device on the substrate is exposed in the bottom of the contact window. Typically, the device is a gate or source/drain region.

Because the device on the substrate is exposed in the bottom of the contact window, the silicon material of the substrate reacts with the gas containing oxygen and a native oxide layer forms thereon. The native oxide layer must be removed before the tungsten plug is formed to decrease the sheet resistance between the tungsten plug and the device. The method of removing the native oxide comprises a physical dry etching process and a wet etching process.

Because the native oxide layer is very thin, typically several angstroms to tens of angstroms, the plasma for physical dry etching easily damages the substrate. For this reason, wet etching is typically used to remove the native oxide layer. The method of the wet etching process comprises a substrate sunken in the aqueous solution of hydrogen fluoride and ammonia to remove the native oxide layer. In order to separate the sidewall of the contact window from the etching solution, a spacer is formed on the sidewall of the contact window before the wet etching process. The material for forming the spacer is silicon oxide, silicon nitride or silicon carbon (SiC). The method for fabricating the spacer includes first forming an insulation layer on the borophosphosilicate glass layer, the sidewall and the bottom of the contact window, wherein overhangs are formed at an opening of the contact window, the method for forming the insulation layer is a plasma enhanced chemical vapor deposition (PECVD). Then, the insulation layer is etched to further expose the surface of the borophosphosilicate glass layer, the insulation layer on the bottom of the contact window is removed and the spacer is formed on the sidewall of the contact window. A wet etching process is performed, part of the spacer is removed and the native oxide on the bottom of the contact window is also removed to expose the device on the substrate. The etching selectivity between the native oxide and the spacer must be smaller than 1. Only one material on the sidewall of the contact window is etched by etching solution. Accordingly, the problem of the etching selectivity does not exist. At the same time, a contact window having a continuous profile is obtained.

Subsequently, a conformal titanium/titanium nitride (Ti/TiN) layer or tantalum/tantalum nitride (Ta/TaN) layer is deposited to cover the bottom and the sidewall of the contact window as a glue layer or a barrier layer. A tungsten layer is deposited on the glue or barrier layer by a chemical vapor deposition process and fills the contact window. Finally, a tungsten etching back process is executed to further expose the surface of the borophosphosilicate glass layer and the tungsten plug has been formed.

Moreover, in this invention, the refractive index of the silicon oxide for forming the spacer is high than 1.46. Typically, the refractive index of the silicon oxide is less than 1.46. The higher refractive index of the silicon oxide means more unsaturated silicon bonds contained in this material. The unsaturated silicon bonds in the silicon oxide spacer trap the hydrogen penetrating in to avoid the reduction reaction of the $WF_6$.

It is to be understood that both the foregoing general description and the following detailed description are examples only and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
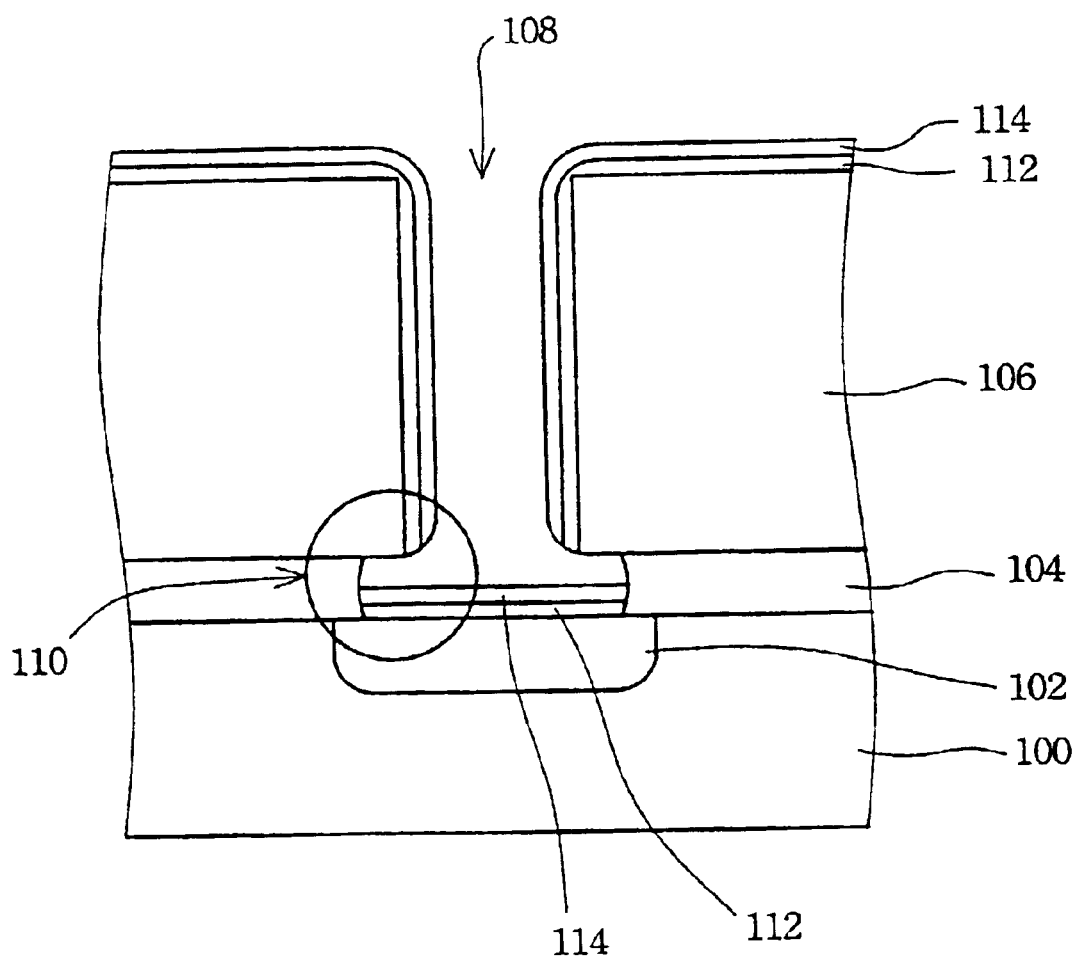
FIG. 1 is schematic, cross-sectional diagram showing a contact window disclosed in the prior art.
Figure 2:
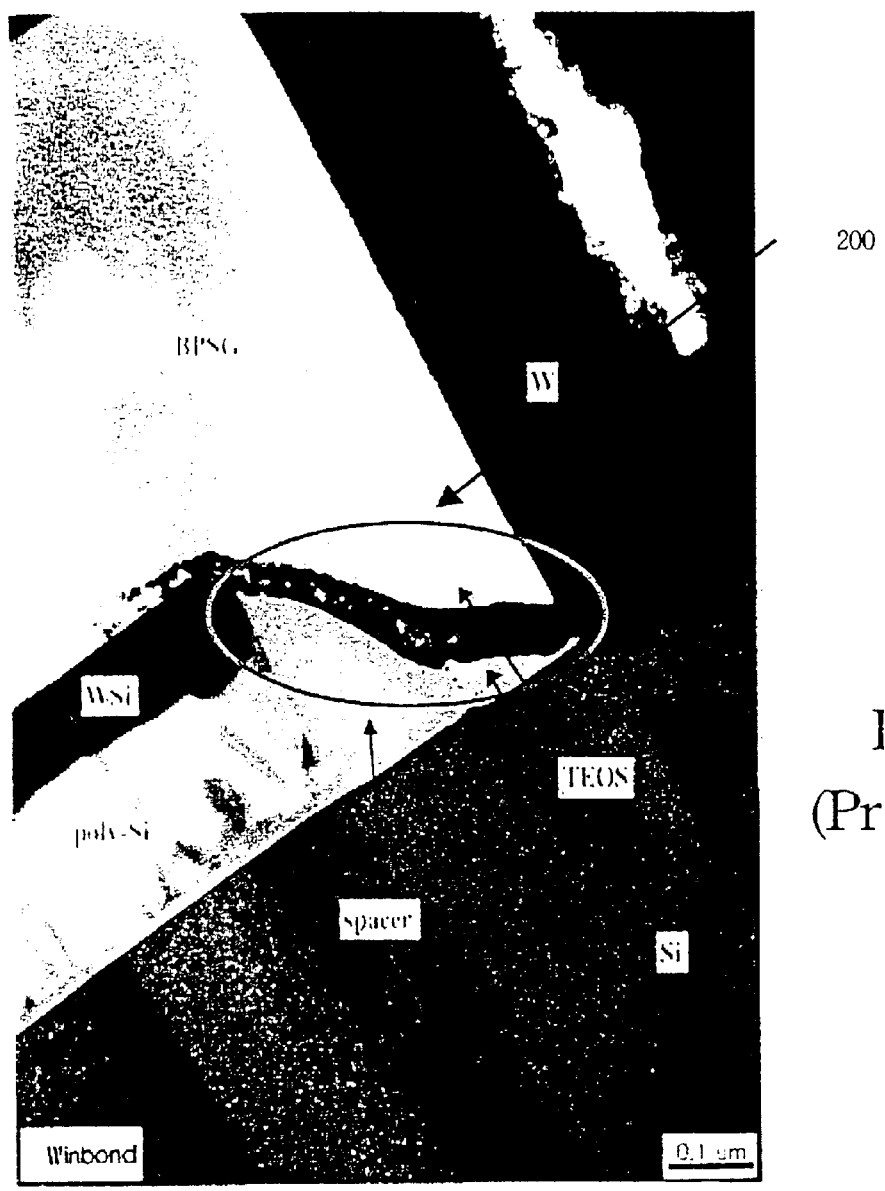
FIG. 2 is a transmitting electron microscope image of FIG. 1.
Figure 3:
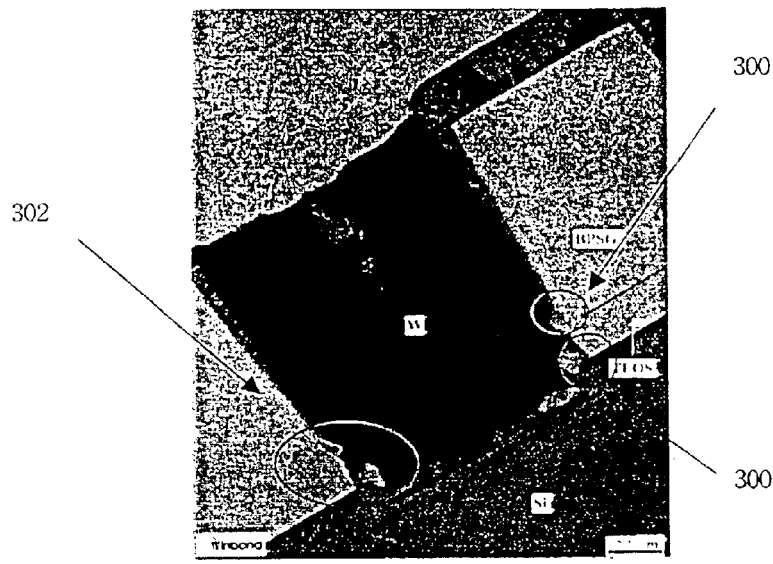
FIG. 3 is a transmitting electron microscope image of a failed device.

Reference will now be made in detail to the present preferred embodiments of the invention, examples of which are illustrated in the accompanying drawings. Wherever possible, the same reference numbers are used in the drawings and the description to refer to the same or like parts.

FIGS. 4 to 8 are schematic, cross-sectional diagrams showing processes for fabricating a tungsten plug in the contact window having a continuous profile according to the preferred embodiment of the present invention.

Figure 4:
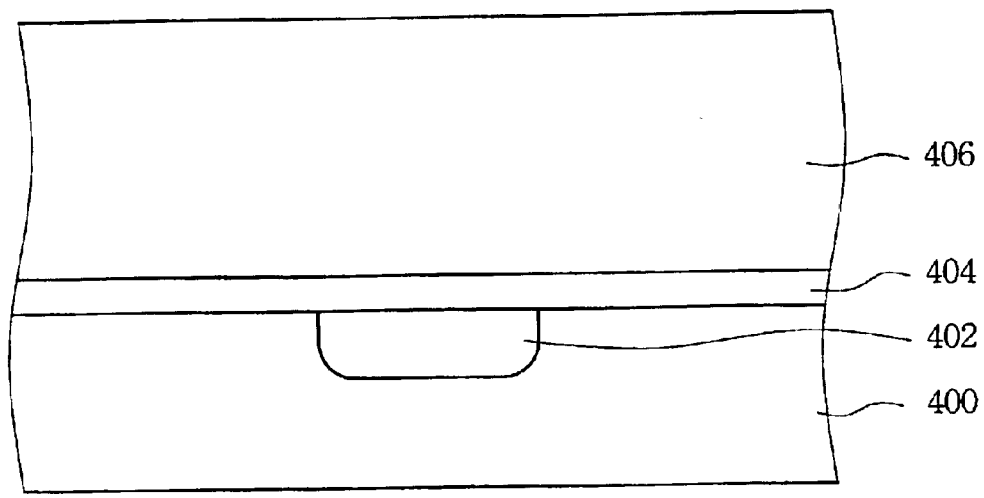
FIGS. 4 to 8 are schematic, cross-sectional diagrams showing processes for fabricating a tungsten plug in the contact window having a continuous profile according to the preferred embodiment of the present invention.

Reference is made to FIG. 4. A substrate 400 having a device 402 formed therein is provided. A silicon oxide layer 404 is deposited on substrate 400. The material of the silicon oxide layer 404 is formed by a low pressure chemical vapor deposition (LPCVD) process and the starting material for this process is tetraethyl orthosilicate and ozone (O3-TEOS). The thickness of the silicon oxide layer 404 is about 1000 angstroms. Next, a borophosphosilicate glass layer 406 is formed on the silicon oxide layer 404 as an inter-layer-dielectric layer. The thickness of the borophosphosilicate glass layer is between about 1000 angstroms and 5000 angstroms. The surface of the borophosphosilicate glass layer is planarized by a chemical mechanical polishing (CMP) process or a thermal flow process.

Figure 5:
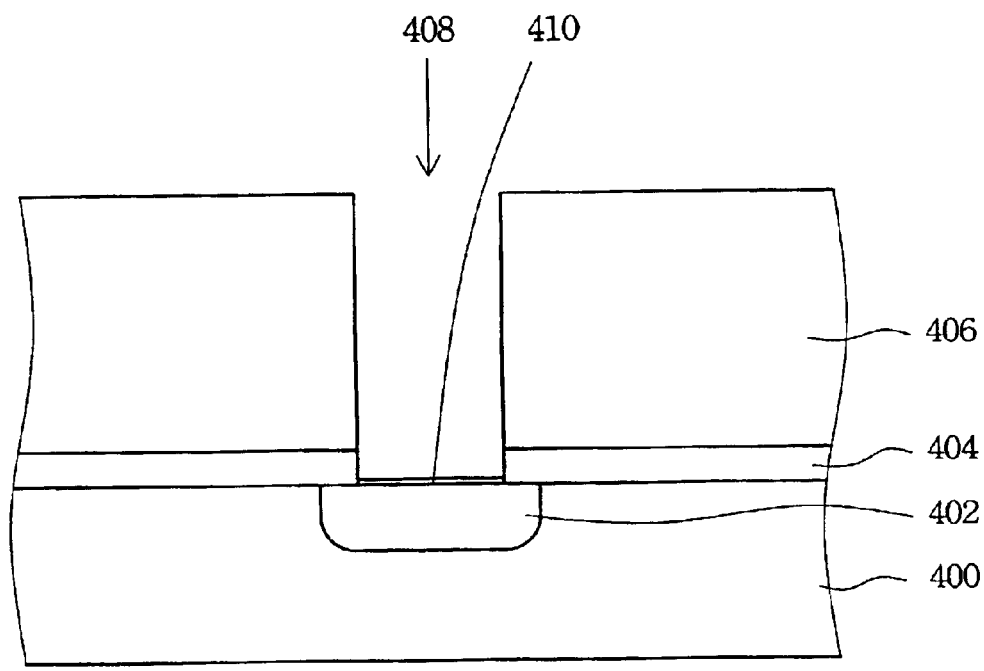

Reference is made to FIG. 5. A photo-resist layer (not shown in the scheme) is then formed on the borophosphosilicate glass layer 406. The photo-resist layer is patterned and the position of the contact window 408 is then defined. The patterned photo-resist layer (not shown in the scheme) is used as a mask, the borophosphosilicate glass layer 406 and the silicon oxide layer 404 are etched and the contact window 408 is formed therein. The device 402 on the substrate 400 is exposed in the bottom of the contact window 408. Typically, the device 402 is a gate or a source/drain region.

Because the device 402 on the substrate 400 is exposed in the bottom of the contact window 408, the silicon material of the substrate 400 reacts with the gas containing oxygen and a native oxide layer 410 forms thereon. The native oxide layer 410 must be removed before the tungsten plug (not shown in the scheme) is formed to decrease the sheet resistance between the tungsten plug and the device 402. The method of removing the native oxide layer 410 comprises a dry etching process and a wet etching process.

Figure 6:
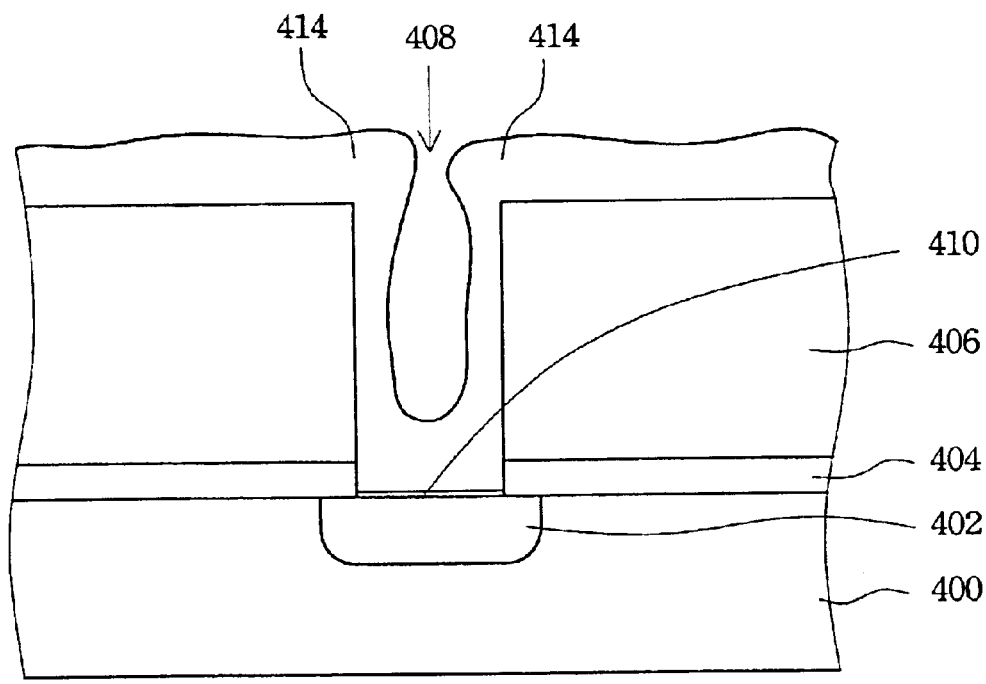

Reference is made to FIG. 6. An insulation layer 412 is deposited on the borophosphosilicate glass layer 406 and the profile of the contact window 408 by plasma enhanced chemical vapor deposition process, the material for forming the spacer is silicon oxide, silicon nitride or silicon carbon (SiC) and the method for forming the insulation layer is a plasma enhanced chemical vapor deposition (PECVD). The insulation layer 412 has an overhang 414. The overhang 414 shields the material on the sidewall and bottom of the contact window 408; therefore, when the insulation layer 412 on the borophosphosilicate glass layer 406 is removed by an etching process, all material on the bottom of the contact window 408 is also removed. If the silicon oxide is chosen as the material for forming the insulation layer 412, the refractive index of silicon oxide is higher than 1.46, typically, the refractive index of the silicon oxide is around 1.46. The higher refractive index of the oxide means more unsaturated silicon bonds are contained in this material. The unsaturated silicon bond can trap the hydrogen that penetrates in. Even though the $WF_6$ gas penetrates into the inter-layer-dielectric layer, the reduction reaction does not occur because the reducing reagent, hydrogen, is exhausted.

Figure 7:
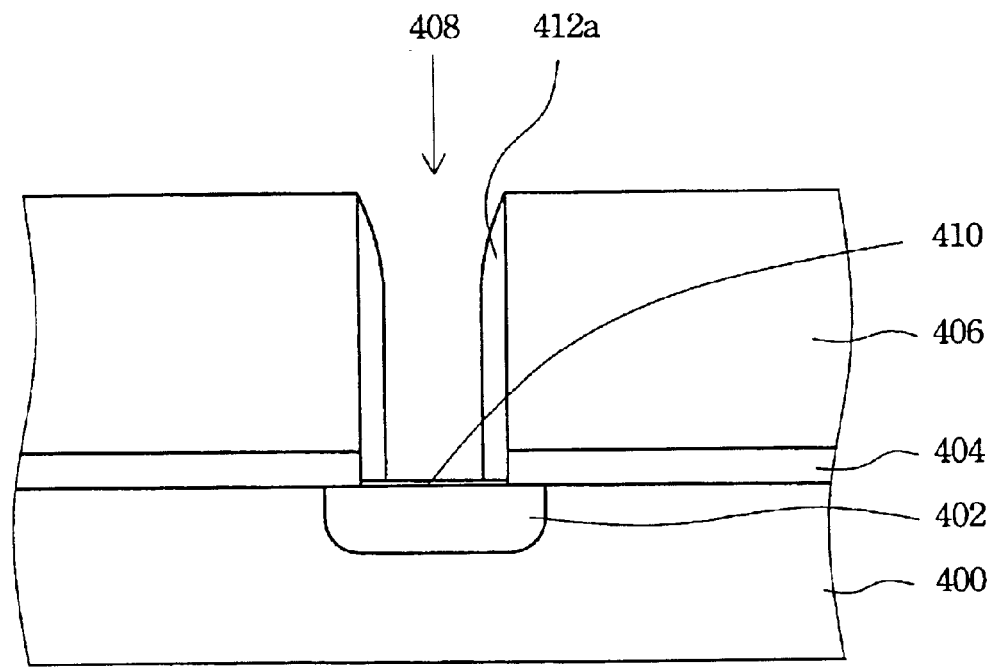

Reference is made to FIG. 7. The insulation layer 412 is etched to further expose the surface of the borophosphosilicate glass layer 406, the material on the bottom of the contact window 408 is removed and the spacer 412a is formed on the sidewall of the contact window 408. This etching process comprises an anisotropic plasma etching process.

With further reference to FIG. 7, the native oxide layer 410 is removed by a wet etching process. The method of the wet etching process comprises submerging the substrate 400 in the aqueous solution of hydrogen fluoride and ammonia to remove the native oxide layer 410 and a portion of the spacer 412a to further expose the device 402 on the substrate 400. Only one material on the sidewall of the contact window 408 is etched by etching solution and thus, the problem of the etching selectivity does not exist. At the same time, a contact window 408 having a continuous profile is achieved.

Figure 8:
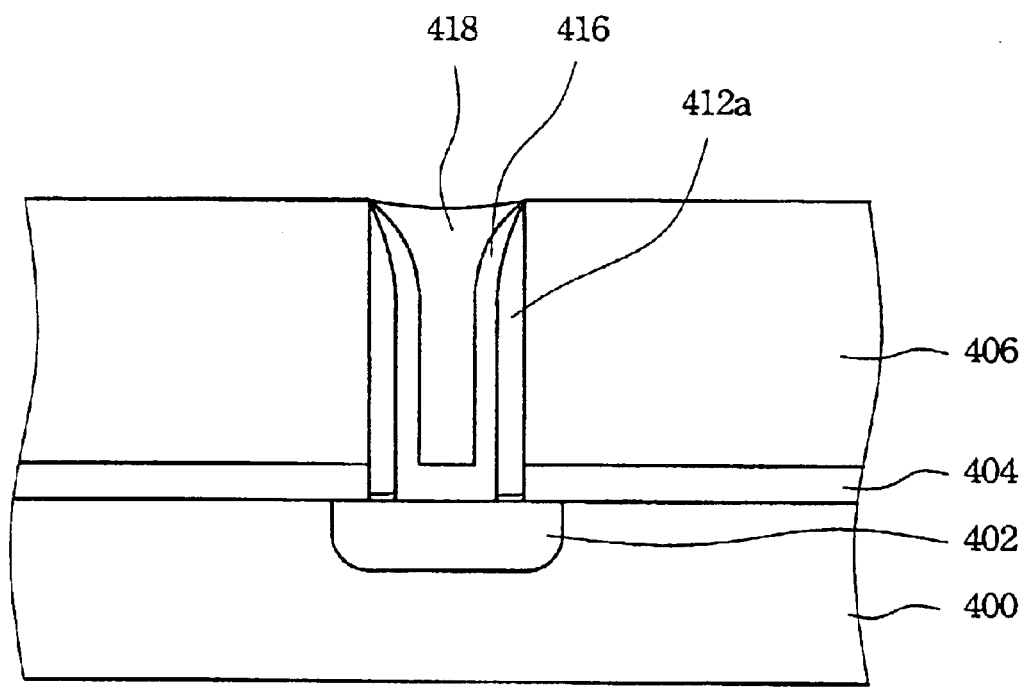

Reference is made to FIG. 8. Subsequently, a conformal titanium/titanium nitride (Ti/TiN) layer or tantalum/tantalum nitride (Ta/TaN) layer 416 is deposited to cover the bottom of the contact window 408 and spacer 412a as a glue layer or a barrier layer. A tungsten layer (not shown in the scheme) is deposited on the titanium/titanium nitride (Ti/TiN) layer or tantalum/tantalum nitride (Ta/TaN) layer 416 by a chemical vapor deposition process and fills the contact window 408. Finally, a tungsten etching back process is executed to further expose the surface of the borophosphosilicate glass layer 406 and the tungsten plug 418 has been formed.

Figure 9:
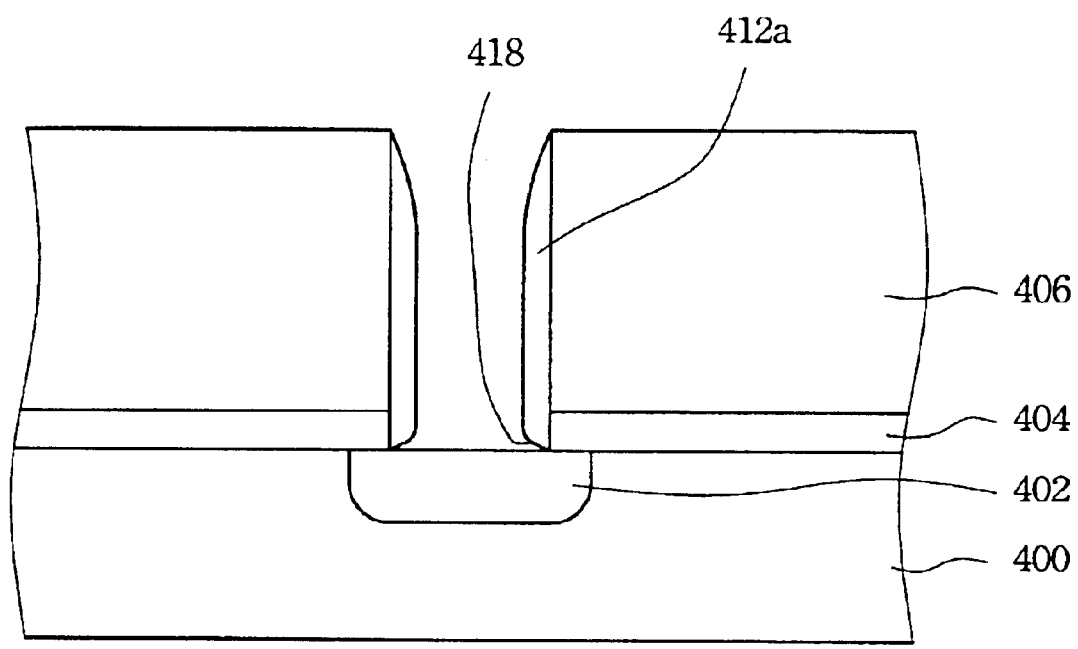
FIG. 9 is schematic, cross-sectional diagram showing a contact window with a faster etching rate for native oxide than for spacer.

The etching selectivity between the native oxide 410 and the spacer 412a must be smaller than 1. Specifically, the spacer 412a must be removed faster than the native oxide. With further reference to FIG. 7, the spacer 412a is formed on the native oxide 410 and the thickness of the native oxide 410 is far thinner than the thickness of the spacer 412a. Reference is made to FIG. 9. If the etching selectivity between the native oxide 410 and the spacer 412a is equal to or larger than 1, the native oxide is completely removed by wet etching and an undercut area 418 is formed between the device 402 and spacer 412a. Thereafter, the phenomenon of the discontinuity of the contact profile will be unavoidable. Tungsten will penetrate into the interface between the substrate 400 and silicon oxide layer 404 through the undercut area 418 to form a tungsten bridge when tungsten is deposited into the contact window 408.

Although more spacer than native oxide is removed when the etching selectivity between the native oxide 410 and the spacer 412a is smaller than 1, all exposed native oxide is removed completely while the spacer remains because the spacer is far thicker than the native oxide. Therefore, the phenomenon of discontinuity of the contact profile is avoided and tungsten deposition at the interface to bridge two devices is avoided as well.

The method provided in this invention is not only used to improve the profile of the contact window but is also used to improve the profile of the via window. The method is used to improve the profile of the via window to avoid formation of a bridge between two conductive lines.

It will be apparent to those skilled in the art that various modifications and variations can be made to the structure of the present invention without departing from the scope or spirit of the invention. In view of the foregoing, it is intended that modifications and variations of this invention are included provided they fall within the scope of the following claims and their equivalents.

What is claimed is:

1. A method for contact profile improvement, wherein the contact is formed on a substrate having at least one element formed thereon, the method comprising:

forming an oxide layer on the substrate;

forming a borophosphosilicate glass layer on the oxide layer;

forming a contact window in the oxide layer and the borophosphosilicate glass layer, wherein the element on the substrate is exposed by the contact window, a silicon material of the element reacts with a gas containing oxygen and native oxide is formed thereon;

forming an insulation layer on the borophosphosilicate glass layer, a sidewall and a bottom of the contact window, wherein overhangs are formed at an opening of the contact window;

forming a spacer on the sidewall of the contact window by etching the insulation layer; and removing the native oxide by a wet etching process, wherein an etching selection ratio (etching rate of the native oxide)/(etching rate of the spacer) is smaller than 1.

2. The method of claim 1, wherein forming the oxide layer at least comprises a low pressure chemical vapor deposition process with tetraethyl orthosilicate and ozone as starting material.

3. The method of claim 1, wherein a thickness of the oxide layer is about 1000 angstroms.

4. The method of claim 1, wherein a thickness of the borophosphosilicate glass layer is between about 1000 angstroms and 5000 angstroms.

5. The method of claim 1, wherein an etching solution for the wet etching process at least comprises an aqueous solution of hydrogen fluoride and ammonia.

6. The method of claim 1, wherein the materials for forming the insulation layer comprise silicon oxide, silicon nitride and silicon carbon.

7. The method of claim 6, wherein a refractive index of the silicon oxide material for forming the insulation layer is larger than about 1.46.

8. The method of claim 1, wherein the purpose of the insulation layer is to apart the profile of the contact window from the acid solution and gas.

9. The method of claim 1, wherein the insulation layer has an overhang at the opening of the contact window.

10. A method for fabricating a contact plug, wherein the contact plug is formed on a substrate having at least one element formed thereon, the method comprising:

forming a first oxide layer on the substrate;

forming a borophosphosilicate glass layer on the first oxide layer;

forming a contact window in the first oxide layer and the borophosphosilicate glass layer, wherein the element on the substrate is exposed by the contact window, a silicon material of the element reacts with a gas containing oxygen and a native oxide is formed thereon;

forming a second oxide layer on the borophosphosilicate glass layer, a sidewall and a bottom of the contact window, wherein overhangs are formed at an opening of the contact window;

forming a spacer on the sidewall of the contact window by etching the second oxide layer;

removing the native oxide by a wet etching process, wherein an etching selection ratio (etching rate of the native oxide)/(etching rate of the spacer) is smaller than 1;

forming a conformal metal/metal nitride layer to cover the substrate;

forming a tungsten layer on the metal/metal nitride layer and filling the contact window; and etching back the tungsten layer and the metal/metal nitride layer to further expose the surface of the borophosphosilicate glass layer.

11. The method of claim 10, wherein forming the first oxide layer at least comprises a low pressure chemical vapor deposition process with tetraethyl orthosilicate and ozone as starting material.

12. The method of claim 10, wherein a thickness of the first oxide layer is about 1000 angstroms.

13. The method of claim 10, wherein a thickness of the borophosphosilicate glass layer is between about 1000 angstroms and 5000 angstroms.

14. The method of claim 10, wherein an etching solution for the wet etching process at least comprises an aqueous solution of hydrogen fluoride and ammonia.

15. The method of claim 10, wherein a refractive index of a second oxide material for forming the second oxide layer is larger than 1.46.

16. The method of claim 10, wherein the insulation layer has an overhang at the opening of the contact window.

17. A method for contact window profile improvement, wherein the contact window is formed in a dielectric layer on a substrate, a conductive line element is exposed thereby and a silicon material of the element reacts with a gas containing oxygen and a native oxide is formed thereon, the method comprising:

forming an oxide spacer on the sidewall of the contact window; and removing the native oxide on the bottom of the contact window by a wet etching process, wherein an etching selection ratio, (etching rate of the native oxide)/(etching rate of the spacer), is smaller than 1.

18. The method of claim 17, wherein the dielectric layer comprises at least two layers made of different material.

19. The method of claim 17, wherein an etching solution for the wet etch process at least comprises an aqueous solution of hydrogen fluoride and ammonia.

20. The method of claim 17, wherein a refractive index of a second oxide material for forming the second oxide layer is larger than 1.46.

* * * * *